United States Patent
Patel et al.

(10) Patent No.: US 7,310,737 B2
(45) Date of Patent: Dec. 18, 2007

(54) COOLING SYSTEM FOR COMPUTER SYSTEMS

(75) Inventors: Chandrakant D. Patel, Fremont, CA (US); Keith Istvan Farkas, San Carlos, CA (US); Gopalakrishnan Janakiraman, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 551 days.

(21) Appl. No.: 10/608,151

(22) Filed: Jun. 30, 2003

(65) Prior Publication Data

US 2004/0264124 A1 Dec. 30, 2004

(51) Int. Cl.
 *G06F 1/26* (2006.01)
(52) U.S. Cl. .................................. 713/300; 713/324
(58) Field of Classification Search ............... 713/300, 713/324
See application file for complete search history.

(56) References Cited

U.S. PATENT DOCUMENTS

| | | | |
|---|---|---|---|
| 4,386,733 A * | 6/1983 | Bradshaw | 236/49.3 |
| 6,188,189 B1 | 2/2001 | Blake | |
| 6,487,463 B1 | 11/2002 | Stepp, III | |
| 6,535,382 B2 | 3/2003 | Bishop et al. | |
| 6,946,363 B2 * | 9/2005 | Davidson | 438/455 |
| 2002/0183869 A1 * | 12/2002 | Chaiken et al. | 700/79 |

* cited by examiner

*Primary Examiner*—Rehana Perveen
*Assistant Examiner*—Tse Chen

(57) ABSTRACT

A cooling system for cooling computer systems detects heat dissipated by the computer systems. If the heat dissipated by the computer systems exceeds a threshold, at least one component of the computer systems is placed in a lower-power state to reduce heat dissipation.

14 Claims, 10 Drawing Sheets

COOLING SYSTEM FOR COMPUTER SYSTEMS

FIELD OF THE INVENTION

This invention relates generally to cooling systems. More particularly, the invention relates to cooling systems for computer systems.

BACKGROUND OF THE INVENTION

Computer systems typically include components that generate/dissipate considerable amounts of heat. These components may include one or more processors (e.g., central processing units, multi-chip modules, etc.), system boards having printed circuit boards (PCBs) in general, memory, power supplies, and other circuits. In recent years, these components have become more dense and, hence, generate more heat during operation. Excessive heat tends to adversely affect the performance and operating lives of these components. Furthermore, when a plurality of computer systems are stored in the same location, as in a rack, there is an even greater potential for the adverse effects of overheating.

In order to substantially guarantee proper operation, and to extend the life of the computer systems, it is necessary to maintain the temperatures of the components within predetermined safe operating ranges. Operation at temperatures above maximum operating temperatures may result in irreversible damage to the components. In addition, it has been established that the reliabilities of components, such as semiconductor electronic devices, decrease with increasing temperature. Therefore, the heat dissipated by the components during operation should be removed at a rate that ensures that operational and reliability requirements are met.

Cooling systems are used to remove heat generated by components in computer systems. Cooling systems may include fans, air conditioning units, cooling liquid, etc., to facilitate heat dissipation. Racks housing multiple computer systems generally utilize a cooling system to cool the computer systems.

Typically, the distribution of work among the computer systems in the rack is random and is not controlled. Because of work distribution, some components of the computer systems may be operating at a maximum capacity, while at the same time, other components may be operating at various power levels below a maximum capacity.

Regardless of the power level and heat dissipation of components at varying power levels, cooling systems are typically designed to uniformly cool components based on a maximum heat dissipation of the components. That is cooling systems are designed to remove heat from components as if the components are continually operating at maximum capacity or power levels (i.e., in an operating state where the components are dissipating the maximum amount of heat). Furthermore, cooling systems are typically designed to cool computer systems that are fully provisioned (i.e., fully upgraded). For example, a computer system may be upgraded (or provisioned) by adding or replacing components (e.g., faster processors, more memory, etc.) that dissipate more heat. Typically, a cooling system is used that is capable of sufficiently cooling a fully provisioned computer system, regardless of whether the computer system has been fully provisioned.

Generally, components of computer systems do not continually operate at maximum capacity and computer systems may operate at varying power levels over time. For example, one server may have a heavier workload than another server at any given time. Consequently, conventional cooling systems, which are designed to cool computer systems continually operating at maximum capacity, may be energy inefficient, more expensive and more complex than necessary for adequately cooling heat generating components of one or more computer systems.

SUMMARY OF THE INVENTION

According to an embodiment, a cooling system comprises temperature sensors operable to detect heat dissipated by the computer systems, and at least one circuit operable to compare an amount of heat being dissipated by the computer systems to a threshold associated with a maximum cooling capacity of the cooling system. The circuit is operable to place one or more of at least one of the computer systems and at least one electrical component in the computer systems in a lower-power state to reduce heat dissipation in response to the amount of heat being dissipated exceeding the threshold.

According to another embodiment, a method of cooling computer systems using a cooling system comprises determining an amount of heat dissipated by the computer systems; comparing the amount of heat being dissipated by the computer systems to a threshold associated with a maximum cooling capacity of the cooling system; and placing one or more of at least one of the computer systems and at least one electrical component in the computer systems in a lower-power state to reduce heat dissipation in response to the amount of heat being dissipated exceeding the threshold.

According to another embodiment, a method for designing a cooling system operable to cool multiple computers housed in a rack comprises determining a nominal heat dissipation of the computer systems whereby the nominal heat dissipation is less than a maximum heat dissipation of the computer systems; selecting components for the cooling system based on the nominal heat dissipation; and deploying the cooling system to cool the computer systems.

According to another embodiment, an apparatus for controlling cooling of one or more computer systems comprises means for determining an amount of heat dissipated by the computer systems; means for comparing the amount of heat being dissipated by the computer systems to a threshold associated with a maximum cooling capacity of the cooling system; and means for placing one or more of at least one of the computer systems and at least one electrical component in the computer systems in a lower-power state to reduce heat dissipation in response to the amount of heat being dissipated exceeding the threshold.

According to another embodiment, a rack system comprises an enclosure housing multiple computer systems and a cooling system distributing cooling fluid to the multiple computer systems based on an amount of heat dissipated by the computer systems. The cooling system is designed based on nominal heat dissipation of the computer systems, whereby the nominal heat dissipation is less than a maximum heat dissipation of the computer systems.

BRIEF DESCRIPTION OF THE DRAWINGS

The present invention is illustrated by way of example and not limitation in the accompanying figures in which like numeral references refer to like elements, and wherein.

DETAILED DESCRIPTION OF EMBODIMENTS

Figure 1:
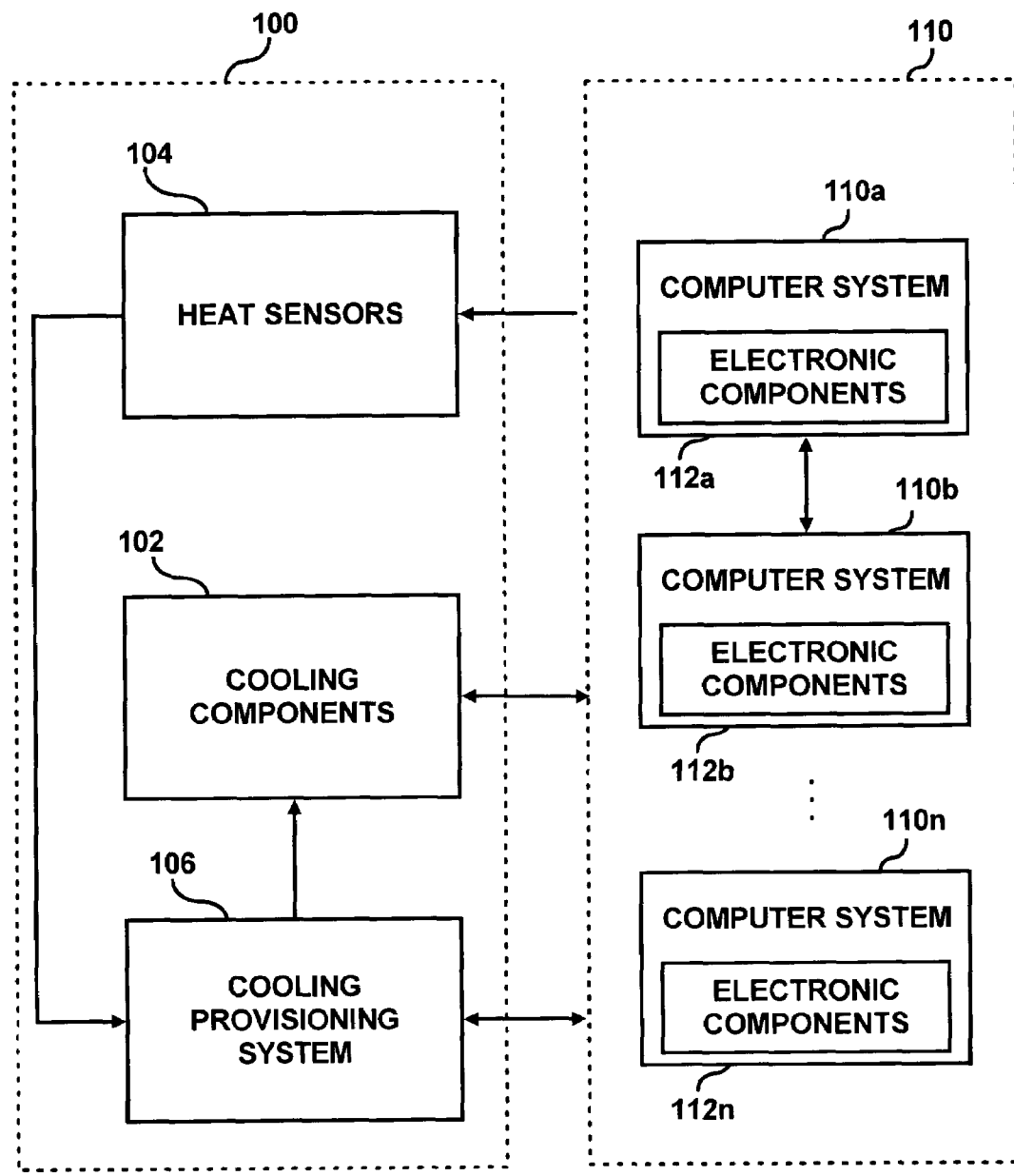
FIG. 1 illustrates a block diagram of a cooling system connected to computer systems, according to an embodiment of the invention.

According to an embodiment, a cooling system for one or more computer systems is designed and implemented based on a nominal heat dissipation of the computer systems (i.e., heat generated by components of the computer systems) rather than being based on maximum heat dissipation by the computer systems. For example, nominal heat dissipation may be estimated based on the average heat dissipated by components of the computer systems, or nominal heat dissipation may be a standard deviation of the average heat dissipation. Other statistical techniques may be used to determine nominal heat dissipation, which may be based on actual measurements or estimations of heat dissipation. Alternatively, the nominal heat dissipation may be based on the heat dissipation of a computer system running a typical workload (e.g., the workload the computer system may run for a majority of its operation time). The workload of a computer system may be known or estimated by historical measurements of workload for the computer system, monitoring workload of existing computer systems or by testing.

Specifications provided by component manufacturers and/or actual heat dissipation measurements may be used to determine average heat dissipation for the computer system. If a workload of a computer system over time is known or predictable, the nominal heat dissipation may be estimated or measured based on the computer system operating at the known or predicted workload or the average workload (known or estimated). Also, through simulations (e.g., running a computer system at predetermined workloads), the nominal heat dissipation of a computer system may be measured.

The cooling system is operable to maintain the temperatures of components of the computer systems within predetermined ranges when the computer systems are dissipating the nominal amount of heat. By designing cooling systems based on nominal heat dissipation rather than maximum heat dissipation, generally, more efficient and cost effective cooling systems may be used. For example, smaller fans or less complicated coolant systems may be used, because a smaller amount of heat is being removed. Also, significantly less energy may be required to power the cooling system based on nominal heat dissipation. For example, a computer system may have a nominal heat dissipation of 200 Watts (W) and a maximum heat dissipation of 350 W. Significantly more energy is required to cool the computer system dissipating 350 W rather than 200 W, especially when multiple computer systems are being cooled. As an approximation, the energy needed to cool a computer system (e.g., power used by a blower) is generally 10% of the amount of heat being dissipated by the computer system (e.g., 35 W of energy to cool 350 W of heat dissipation and 20 W to cool 200 W of heat dissipation). Based on this example, a power savings of 15 W (approximately 43%) is achieved per computer when a fixed velocity component (e.g., blower or a fan) is used.

According to another embodiment, a cooling provisioning system is utilized to control the amount of cooling fluid applied to a computer system. Cooling fluid may include any substance that can transfer heat (e.g., air, refrigerant, etc.). In a multi-computer system environment, such as a rack system where multiple computer systems are housed in a rack, one computer system (e.g., components in the computer system) may dissipate more heat than another computer system at any given time. For example, one server may have a heavier workload (e.g., executing more applications or processes) than another server in the rack system, resulting in more heat being dissipated by the server with the heavier workload. Instead of uniformly cooling each computer system, cooling fluid is provisioned based on heat dissipation. Thus, the server with the heavier workload and dissipating more heat receives more cooling fluid than the server dissipating less heat. By provisioning the cooling fluid, the cooling system designed based on nominal heat dissipation can accommodate instances where one or more computer systems dissipate a greater amount of heat than a respective nominal heat dissipation. In these instances, the cooling provisioning system may apply less cooling to the computer system(s) dissipating less heat and more cooling may be applied to computer system(s) dissipating more heat. Cooling may be applied such that substantially all the components are maintained within predetermined temperature ranges.

If necessary, one or more components/computer systems may be placed in a lower-power state if the total amount of heat being dissipated is close to exceeding the cooling capacity of the cooling system. Because, the cooling system is designed based nominal heat dissipation, there may be some instances when the maximum cooling capacity of the cooling system may not be able to meet the cooling demand of the computer systems (e.g., when all the computer systems are operating at maximum capacity and dissipating a maximum amount of heat). The cooling provisioning system minimizes the possibility of damage to components and decreased life expectancy caused by insufficient cooling for a computer system by placing components/computer systems in a lower-power state.

The cooling provisioning system monitors the heat dissipated by components in the computer systems. When the heat dissipation (e.g., the sum of the heat dissipated by each computer system) is greater than a predetermined threshold, the cooling provisioning system may place one or more components in a low-heat dissipation or lower-power state to reduce the amount of heat being dissipated by a computer system. When the heat dissipation of the computer systems is decreased, for example, due to lighter workloads, excess cooling fluid may be available because less cooling fluid is needed to cool the computer systems. The cooling system may compare an amount of cooling fluid being provided to cool the computer systems to an excess cooling threshold. If the amount of cooling fluid being used is less than the excess cooling threshold, then the cooling system determines that excess cooling fluid is available. If excess cooling fluid is available, then one or more components in a lower-power state may be placed in a higher-power state to improve performance.

The predetermined threshold may be based on the maximum cooling capacity of the cooling system (e.g., the maximum amount of heat that can be removed by the cooling system to reduce the temperature to within a predetermined, optimal, operating range). For example, the threshold may be associated with a value less than the maximum cooling capacity. Therefore, prior to the cooling system reaching its maximum heat removal rate, heat dissipation for a computer system may be reduced to minimize the possibility that sufficient cooling is not available to maintain components of the computer system within a predetermined, optimal temperature range. The maximum cooling capacity of the cooling system may also be based on nominal heat dissipation. For example, the maximum cooling capacity is associated to or substantially equal to the aggregate of the nominal heat dissipation of each computer system in a rack system.

FIG. 1 illustrates a block diagram of a cooling system 100 connected to one or more computer systems 110 (e.g., computer systems 110a . . . n). The cooling system 100 includes cooling components 102 for removing heat dissipated by electrical components 112a . . . n of the computer systems 110. The cooling components 102 may include fans, air flow direction equipment, coolant, valves, valve controllers, pumps, etc., depending on the type of cooling system being implemented. The electrical components 112a . . . n may include conventional components of a computer system, such as one or more processors, memory (e.g., RAM, ROM, etc.), storage devices (e.g., hard drives, etc.), video cards, user input devices, power supplie(s), and the like. The components 112a . . . n may vary depending on the type of computer system 100. For example, the computer system 100 may include a "white box" server, a server in a rack system (e.g., a blade), a desktop computer, a laptop computer, a portable computing device (e.g., personal digital assistant, etc.), and the like. Certain components may be used for certain types of computer systems. For example, a server may include multiple central processing units (CPUs), and a personal computer may include one CPU.

The cooling system 100 also comprises heat sensors (e.g., thermistors, thermocouples, etc.) 104 and a cooling provisioning system 106. The heat sensors 104 are also referred to as temperature sensors. The heat sensors 104 detect the amount of heat being dissipated by the computer systems 110 and may measure heat dissipation continuously or periodically. Heat dissipation may be measured in Watts (W). Heat dissipation in Watts, Q, can be determined using equation (1) through determination of mass air flow (e.g., product of volume of air per unit time and air density), specific heat capacity of air ($C_p$) and difference in temperature across the computer system or computer system component.

$$Q = \dot{m} C_p (T_{OUT} - T\text{in}) \qquad \text{Equation (1)}$$

Heat sensors may be provided at an air inlet (e.g., location where cool air is applied to cool the computer system) and air outlet (e.g., location where heated air leaves the computer system(s)) to measure the temperatures Tin and Tout, respectively. In addition, or alternatively, temperature sensors provided near one or more components of the computer system(s) may be used. The temperature sensors may also be located within the computer system(s). The detected heat dissipation is transmitted to the cooling provisioning system 106. The cooling provisioning system 106 controls the cooling components 102 cooling the computer systems 110 based on the heat being dissipated by the computer systems 110. Equation 1 is described above using air as the cooling fluid. However, equation 1 may be used to determine heat dissipation using any type of cooling fluid, including liquid, that does not change phase. For a liquid-cooled system, for example, temperature sensors may be placed inside or outside a pipe carrying the liquid to and from a computer system, such as in proximity to a fluid inlet and a fluid outlet.

Regarding the provisioning of cooling fluid, for example, the heat sensors 104 may detect 400 W of heat being dissipated by computer system 110a and 100 W of heat being dissipated by computer system 110b. The cooling provisioning system 106 controls the cooling components 102 to distribute a greater amount of cooling fluid (e.g., coolant or air) to the computer system 110a. In the case of air cooling, for example, a volumetric air flow rate of approximately 50 cubic feet per minute (cfm) may be used to cool one or more components of the computer system 110a and approximately 12.2 cfm may be used to cool one or more components of the computer system 110b. Generally, 500 cfm of air flow delivered at sufficient pressure can approximately remove 4000 Watts and 288 cfm can approximately remove 2400 Watts with a temperature difference of 15 degrees Celsius at sea level. The excess cooling fluid being provided to the computer system 110a may be cooling fluid previously directed to the computer system 110b. However, because the computer system 110b is dissipating less heat, less cooling fluid or a lower rate of applied cooling fluid is necessary. The cooling provisioning system 106 is operable to provision cooling fluid as the heat dissipation per computer system varies. Because of the dynamic cooling provided by the cooling provisioning system 106, the cooling system 100 may be designed based on nominal heat dissipation rather than maximum heat dissipation.

The cooling provisioning system 106 is also operable to place one or more of the computer systems 110 in a lower-power state to reduce heat dissipation when necessary. The cooling provisioning system 106 receives heat dissipation measurements from the heat sensors 104. Alternatively, the heat sensors 104 may output measurements to memory and/or a storage device for retrieval by the cooling provisioning system 106. The cooling provisioning system 106 may compare the aggregate heat dissipation of all the computer systems 110 to a threshold to determine whether the aggregate heat dissipation exceeds the maximum cooling capacity of the cooling system 100. If the aggregate heat dissipation exceeds the threshold, then the cooling provisioning system 106 places one or more of the computer systems 110 in a lower-power consumption state to reduce heat dissipation. The cooling provisioning system 106 may place one or more of the components 112a . . . 112n in a lower-power consumption state, rather than an entire computer system to reduce heat dissipation. The cooling provisioning system 106 may also place one or more components in a higher-power state, when excess cooling fluid is available to cool the components.

Figure 2:
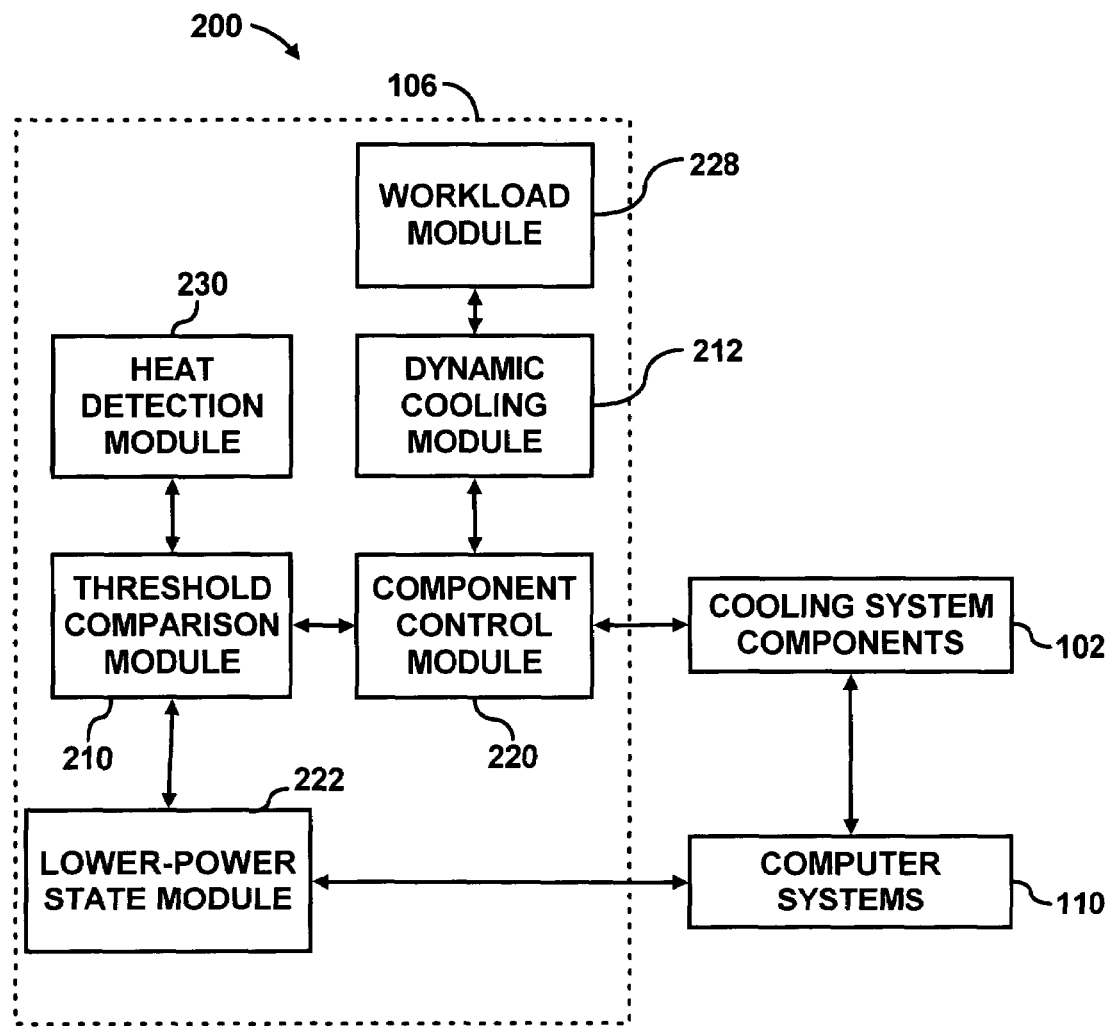
FIG. 2 illustrates a software architecture of a cooling system, according to an embodiment of the invention.

The cooling provisioning system 106 may include a software-based, expert system. FIG. 2 illustrates an exemplary software architecture 200 for the cooling provisioning system 106 shown in FIG. 1, according to an embodiment of the invention. It should be readily apparent to those of ordinary skill in the art that the architecture 200 depicted in FIG. 2 represents a generalized schematic illustration and that other components may be added or existing components may be removed or modified. Moreover, the architecture 200 may be implemented using software components, hardware components, or a combination thereof. Also, the modules of the software architecture 200 may be executed by a system controller, such as one or more processors, or the module(s) may be executed by different system controllers provided in one or more distinct locations.

As shown in FIG. 2, the architecture 200 of the cooling provisioning system 106 may include a heat detection module 230, a threshold comparison module 210, a dynamic cooling module 212, a workload module 228, a lower-power state module 222, and a component control module 220. The heat detection module 230 receives heat dissipation measurements taken by the heat sensors 104 of FIG. 1. The heat sensors 104 measure the heat dissipated by the components 112a . . . n of the computer systems 110 (shown in FIG. 1) either continuously or periodically. These measurements may be transmitted directly to the cooling provisioning system 106 or stored in a memory/storage device for retrieval by the heat detection module 230.

The dynamic cooling module 212 directs cooling to a computer system based on the amount of heat being dissipated by the computer system. According to an embodiment, the heat sensors 104 detect heat for the computer system(s) being cooled. The dynamic cooling module 212 determines the heat dissipation for each computer system from the sensor output.

The dynamic cooling module 212 may communicate with the component control module 220 to instruct the component control module 220 to control the cooling system components 102 to decrease or increase cooling fluid applied to the computer systems 110 based on heat dissipation. For example, if the computer system 110a of FIG. 1 is dissipating more heat than the computer system 110b of FIG. 1, the dynamic cooling module 212 controls the cooling system components 102 to direct more cooling fluid to the computer system 110a. The cooling provisioning system 106 may include modules executed on a conventional computing platform.

The threshold comparison module 210 compares the heat dissipation measurements from the heat sensors 104 with a predetermined threshold to determine whether the heat dissipation of the computer systems 110 may exceed the cooling capacity of the cooling system 100. The threshold comparison module 210 may also compare an amount of cooling fluid being used to an excess cooling fluid threshold. If the amount of cooling fluid being used is below the excess cooling fluid threshold, then the threshold comparison module 210 may invoke another module or system to place one or more components in a higher-power state to improve performance. Referring to FIG. 1, the cooling system 106 may be designed based on the nominal heat dissipation of the computer systems 110 rather than the maximum heat dissipation of the computer systems 110. Therefore, in some instances (e.g., all of the computer systems 110 operating at maximum capacity), the heat dissipation of the computer systems 110 may exceed the cooling capacity of the cooling system 100. The cooling provisioning system 106 may place one or more components/computer systems in a lower-power state to prevent heat dissipation from exceeding the maximum cooling capacity of the cooling system 100.

Referring to FIG. 2, the threshold used by the threshold comparison module 210 may be based on the maximum cooling capacity of the cooling system 100. The threshold may be a value less than the maximum cooling capacity. For example, if the maximum cooling capacity is 10 kW for a rack system (e.g., multiple computers housed in a rack in a data center), the threshold may be set at 9.5 kW to allow sufficient time for the component control module 220 to effectuate a reduction in heat dissipation by the computer systems 110. It will be apparent to one of ordinary skill in the art that the threshold may vary based on the type of computer systems, power density of components and the effect of multiple racks in a room.

The threshold comparison module 210 continually or periodically compares the heat dissipation of the computer systems 110 to the threshold. If the threshold is exceeded, the threshold comparison module 210 invokes the lower-power state module 222 to place one or more of the computer systems 110/components of the computer systems 110, shown in FIG. 1, in a lower-power state for reducing heat dissipation. For example, the lower-power state module 222 may instruct a system board of one of the computer systems 110 to shut down. Applications executed by the computer system being shut down may be executed by another computer system.

Also, the lower-power state module 222 may request a controller of one of the computer systems 110 to place one or more components in a lower-power state. For example, the lower-power state module 222 may instruct a processor to lower its processing speed, resulting in the processor consuming less energy and dissipating less heat. In a multi-processor system, one or more processors may be shut down. Processing may be moved to another computer system 100 if available and if necessary to maintain throughput.

Placing a component in a lower-power state may also include temporarily disabling a floating point unit of a processor to reduce heat dissipation. The floating point unit may be re-activated when the heat dissipation falls below the threshold.

In another example, a portion of a cache or an entire cache may be made inaccessible, or one or more disk drives may be made inaccessible to reduce heat dissipation. The component control module 220 may instruct a cache controller (not shown) or a storage device controller (not shown) to select and manage a cache, a portion of a cache, or a storage device to be temporarily unused for reducing heat dissipation. For example, a controller may identify redundant components that can be temporarily shut down to reduce heat dissipation. Alternatively, a controller may move data to enable a temporary shut down of a storage device or a cache without affecting throughput. Instead of the lower-power state module 222 of the cooling system 200 placing components in a lower-power state, the lower-power state module 222 may request a power provisioning system in a power system (not shown) to place one or more components in a lower-power state. A power provisioning system is described in co-pending and commonly assigned U.S. patent application Ser. No. 10/608,206, entitled, "Controlling Power Consumption of at Least One Computer System", hereby incorporated by reference in its entirety.

A workload module 228 may be connected to the dynamic cooling module 212 to control distribution of cooling fluid to the computer systems 102 based on workload of the computer systems 102. If the workload of the computer systems 102 is predictable, such as based on a workload history for the computer systems 102, then cooling fluid is provisioned accordingly. Thus, if one or more of the computer systems 102 is known to have a heavy workload at a particular time of day, then those computer systems may receive more cooling fluid at that time of day for the duration of the heavy workload.

In addition to provisioning cooling fluid based on workload, the workload module 228 may also prioritize applications executing on the computers 102. The workload module 228 communicates application priority information to the dynamic cooling module 212. The dynamic cooling module 212 may provision cooling to computer systems executing high priority applications such that those computer systems substantially always receive adequate cooling. If insufficient cooling resources are available to cool the computer systems executing the high priority applications, then the applications may be moved if another computer system with better throughput is available. Generally, however, the workload module 228 communicates priority information to the component control module 220, such that computer systems executing the high priority applications are last to be placed in a lower-power state. Priority information may initially be input by a system administrator.

The modules of the cooling system architecture 200 may be implemented as software programs, utilities, subroutines, or other similar programming entities. In this respect, the modules 210-230 may be implemented using software languages such as C, C++, JAVA, etc. Alternatively, the modules may be implemented as an electronic device utilizing an application specific integrated circuit, discrete components, solid-state components or a combination thereof. In addition, the threshold comparison module 210, the lower-power state module 222, and other modules, may be stored and executed on a different computing platform from other modules in the system architecture 200.

Figure 3:
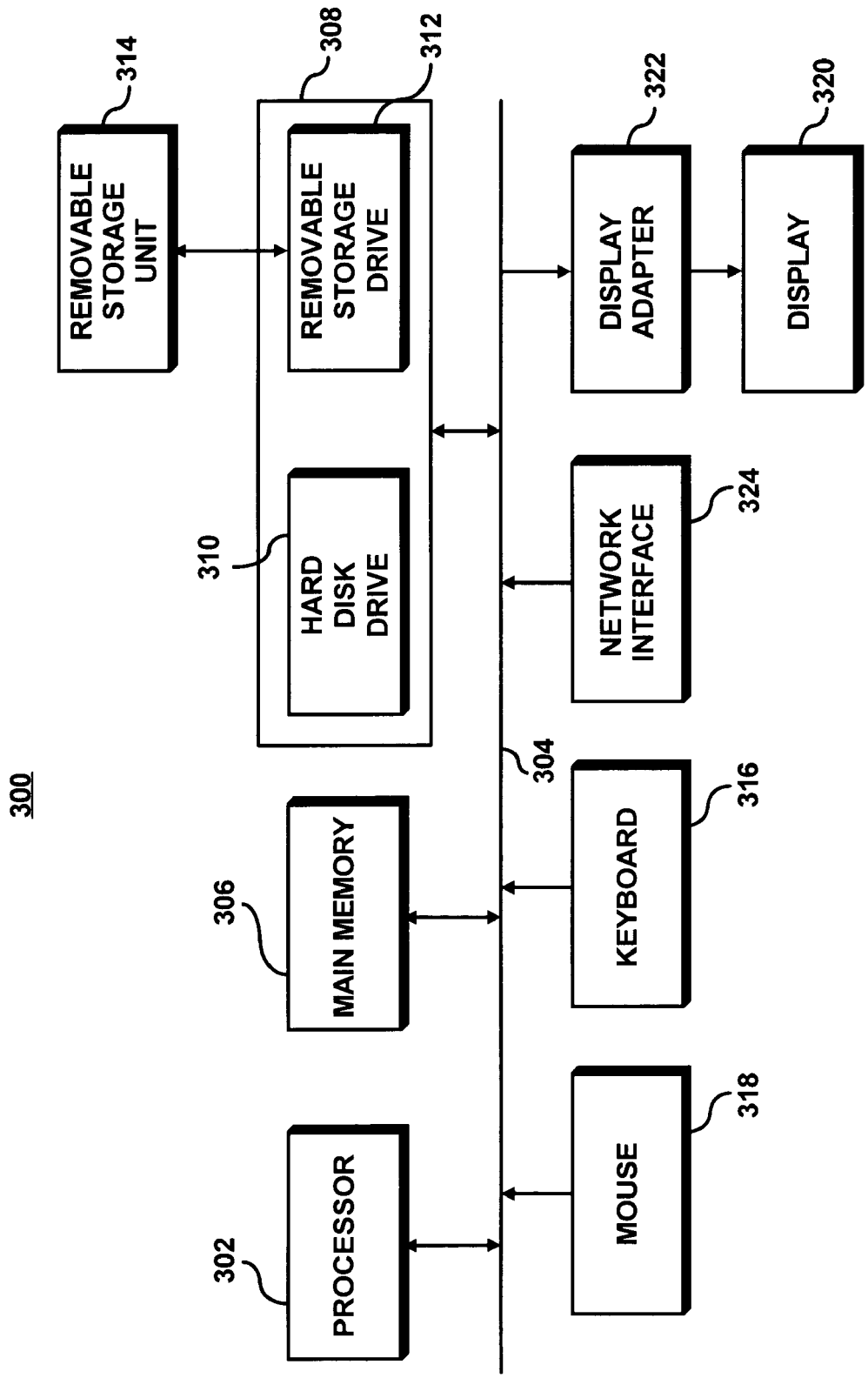
FIG. 3 illustrates a block diagram of a computer system, according to an embodiment of the invention.

FIG. 3 illustrates a computer system 300, according to an embodiment of the invention. The computer system 300 may include one of the computer systems 110 shown in FIG. 1. The computer system 300 also may be used as a platform for executing one or more of the modules shown in FIG. 2. The computer system 300 includes one or more controllers, such as processor 302. The processor 302 may be used to execute modules (e.g., the modules 210-230 of the cooling provisioning system 106 shown in FIG. 2). Commands and data from the processor 302 are communicated over a communication bus 304.

The computer system 300 also includes a main memory 306, such as a random access memory (RAM), where the program code for the provisioning system 106 may be executed during runtime, and a secondary memory 308. The secondary memory 308 includes, for example, one or more hard disk drives 310 and/or a removable storage drive 312, representing a floppy diskette drive, a magnetic tape drive, a compact disk drive, etc., where a copy of the program code for the provisioning system may be stored. The removable storage drive 310 reads from and/or writes to a removable storage unit 314 in a well-known manner. User input and output devices may include a keyboard 316, a mouse 318, and a display 320. The display adaptor 322 interfaces with the communication bus 304 and the display 320 and receives display data from the processor 302 and converts the display data into display commands for the display 320. It will be apparent to one of ordinary skill in the arts that other known electrical components may be added or substituted in the computer system 300. In addition, the computer system 300 may include a system board or blade used in a rack in a data center, a conventional "white box" server or computing device, etc. Also, one or more of the components in FIG. 3 may be optional (e.g., user input devices, secondary memory, etc.). A network interface 324 may also be included for communicating with other computer systems via a network.

Figure 4:
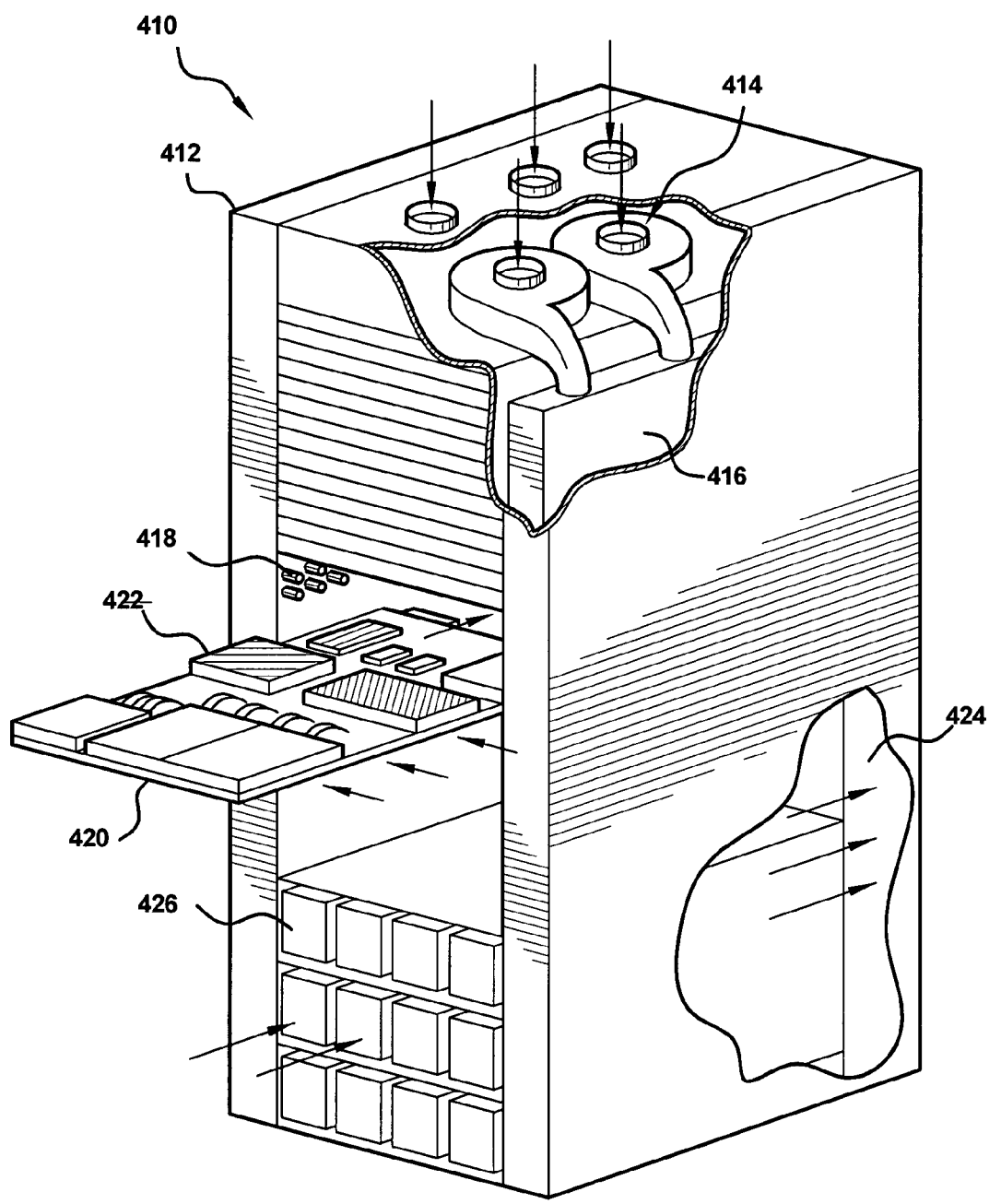
FIG. 4 illustrates a rack system, according to an embodiment of the invention.

FIG. 4 shows a perspective view a rack system 410, according to an embodiment of the invention. The rack system 410 is described in detail below and described in co-pending and commonly assigned U.S. patent application Ser. No. 09/951,730, entitled, "Method and Apparatus for Individually Cooling Components of Electronic Systems", hereby incorporated by reference in its entirety.

While it is apparent that the parts of a rack system 410 may vary from model to model, the rack system 410 generally includes an enclosure 412. The rack system 410 also includes a plurality of blowers 414 operable to draw fluid (e.g., air) from outside the enclosure 412 and deliver the fluid to the space within the enclosure 412. The blowers 414 are variable speed blowers, because they are configured to vary the amount of cooling fluid delivered to the components within the rack system 410 based on measured heat dissipation of components in computer systems housed in the enclosure 412. The blowers 414 may comprise any reasonably suitable blower that is capable of varying the amount of fluid delivered to the space within the enclosure 412. The choice of blower 414 may depend upon a plurality of factors, e.g., cooling requirements, costs, operating expenses, etc. Also, the number of blowers 414 implemented may vary according to cooling needs of the system. According to an embodiment, at least two blowers 414 are implemented to enable a redundant fluid supply, in the event that one of the blowers malfunctions. In addition, a plurality of blowers 414 may be provided to deliver fluid to both sides of the enclosure 412. In this respect, cooling fluid may be substantially simultaneously delivered through both sides of the enclosure 412.

The outlets of the blowers 414 are in fluid communication with a plenum 416. The plenum 416 is in fluid communication with a plurality of nozzles 418. The nozzles 418 have a first end and a second end, in which the first end is connected to the plenum 416. The second ends of the nozzles 418 are configured to outlet fluid from the blowers 414 to one or more heat generating components 422 of a computer system 420, as will be described in greater detail below. The computer system 420 may include a number of heat dissipating components 422, such as shown in FIG. 3. The cooling fluid supplied by the blowers 414, having been relatively heated by the heat generating components 422, may be expelled through an opening through the enclosure 412 as indicated by arrows 424. The rack system 410 may also include a plurality of power modules 426 for supplying power to the components of the subsystems 420 as well as the cooling system.

Figure 5:
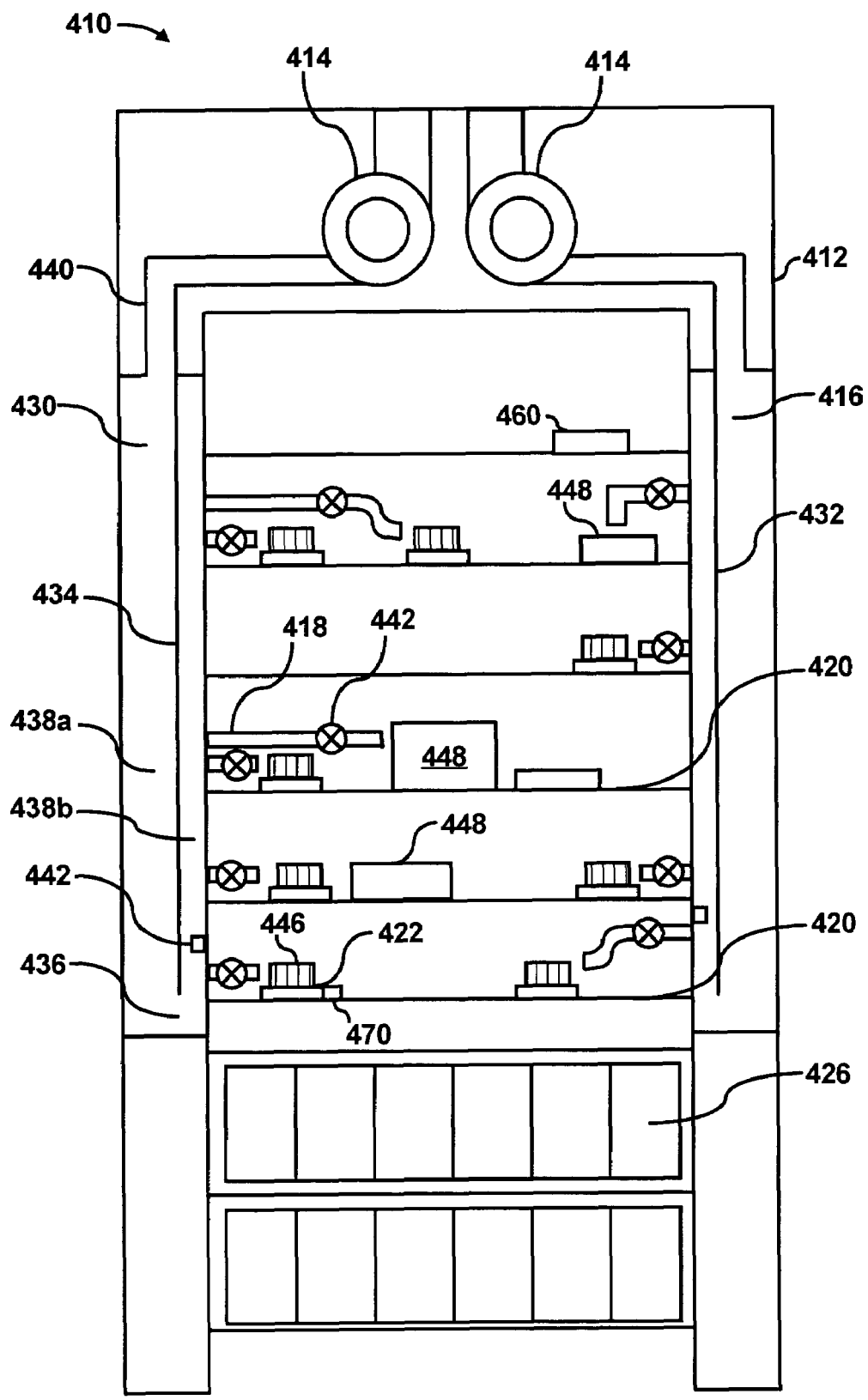
FIG. 5 illustrates a cross section of the rack system of FIG. 4, according to an embodiment of the invention.

Referring now to FIG. 5, there is shown a frontal plan view of the simplified illustration of the rack system 410 illustrated in FIG. 4. As seen in FIG. 5, according to an embodiment of the invention, the blowers 414 are situated to deliver cooling fluid to plena 416, 430 located on both sides of the enclosure 412. The blowers 414 may be positioned to draw air from locations other than the top of the enclosure 412. For example, air may be drawn through slots or a grill from the front of the enclosure 412. Although not illustrated in FIG. 5, a plurality of blowers 414 may be provided to deliver cooling fluid to each of the plena 416, 430 for the purpose of providing a redundant cooling fluid supply to the heat generating components 422. According to an exemplary embodiment, the plena 416, 430 extend substantially the entire width of the enclosure 412 such that a plurality of blowers 414 may supply cooling fluid to each of the plena 416, 430. Alternatively, although not shown in FIG. 5, the plena 416, 430 may comprise a plurality of separate passageways without deviating from the scope of the invention.

The rack system 410 may also include a single plenum 416 along with an associated one or more blower 414. In this instance, cooling fluid flow may be delivered to the components through nozzles having various lengths and extending from the single plenum 416. According to this embodiment, the fluid flow entering into the enclosure 412 may be directed into a single direction to thereby substantially prevent counteracting fluid flows within the enclosure. However, two plena 416, 430 may also be used. For example, a fan (not shown) may be incorporated into the rack system 410 to generally enable heated fluid within the enclosure 412 to be expelled in the manner illustrated in FIG. 4. In this respect, the counteracting fluid flows from the plena 416, 430 may be substantially obviated.

The rack system 410 is shown as including five computer systems 420 and associated components 422, 448 for illustrative purposes only. Rack systems 410 have been known, however, to include upwards of forty or more computer systems 420. The greater the number of computer systems 420, and subsequently the greater the number of heat generating components 422, 448, the greater is the output required from each blower 414 to cool the components 422, 448. By substantially limiting the amount of cooling fluid delivered to the heat generating components 422, 448, even by a relatively small amount, the output required from each blower 414 may be substantially reduced. The substantial reduction in the output of the blowers 414 generally equates to a reduction in the power consumed by the blower, which, in turn equates to a savings in operating costs.

According to an embodiment of the invention, the cooling fluid flow through each of the nozzles 418 may be controlled to flow therethrough at relatively uniform velocities. Furthermore, each uniform velocity may be adjusted using a valve and valve controller to control velocity based on measured heat dissipation.

One manner in which the fluid flow may be controlled is to ensure that the pressure of the fluid supplying each of the nozzles is substantially uniform. In this respect, each of the plena 416, 430 may include a respective divider 432, 434. The width of the dividers 432, 434 may extend substantially along the entire width of the plena 416, 430. The height of the dividers 432, 434 may be slightly shorter than the plena 416, 430 to thus create a gap 436 between a bottom edge of the dividers and a bottom inner surface of the plena. The dividers 432, 434 generally divide the space within the plena 416, 430 into two relatively separate chambers 438a, 438b. The first chamber 438a is in fluid communication with a baffle 440 connected to the blower 414. The second chamber 438b is in fluid communication with the first chamber 438b substantially only through the gap 436. In this respect, the cooling fluid flow originating from the blower 414 must travel substantially the entire height of the plenum 430, i.e., through the first chamber 438a, for the fluid flow to enter into the second chamber 438b.

The fluid in the second chamber 438b may be maintained at a substantially uniform static pressure by virtue of the manner in which the fluid is introduced into the second chamber 438b. Fluid is supplied into the first chamber 438a by the blower 414 at a relatively high rate thereby causing a relatively large amount of turbulence in the fluid located in the first chamber 438a. Because of the distance the fluid must travel to enter into the second chamber, by the time the fluid reaches the gap 436, the fluid has substantially stabilized, thus enabling the fluid entering into the second chamber 438b to be relatively calm. In this respect, the fluid inside the second chamber 438b may be maintained at a relatively uniform pressure.

A plurality of nozzles 418 are in fluid communication with the second chamber 438b of the plenum 430 through attachment of respective first ends thereof to the second chamber 438b. Each of the nozzles 418 includes a respective valve 442 to individually meter the flow of fluid to each of the components 422, 448. Each of the valves 442 may be electronically controlled by a controller 460. A specific type of valve 442 is not required to be utilized with this exemplary embodiment of the present invention, but rather, any reasonably suitable type of controllable metering valve may be utilized. An example of a suitable valve 442 includes a valve operable to increase or decrease the amount of fluid flowing to a component. If the exemplary cooling system of the invention employs this type of valve 442, the controller 460 may be operable to vary the flow of fluid to the component at a wide range of flow rates by controlling the size of the opening through which the fluid flows through the nozzle 442. Another example of a suitable valve includes a pulsating valve. In this type of valve 442, a constant diameter opening may be covered by a lid that is operable to open and close the opening by pulsating. The flow rate of the fluid through the nozzle 442 may be controlled by the controller 460 by varying the frequency of pulsation. For instance, the frequency of pulsation may be increased to decrease the flow rate and the frequency may be decreased to increase the flow rate.

Some of the heat generating components 422, e.g., processors, which generate relatively significant amounts of heat, are illustrated as comprising heat sinks 446 attached to upper surfaces thereof. Other components 448, e.g., memory devices and ASICS, which generate lesser amounts of heat but nevertheless still require supplemental cooling are not illustrated as having heat sinks. The heat sinks 446 may be attached to the heat generating components 422, for example, by soldering, epoxy, thermal compound, and the like). Alternatively, the heat sinks 446 may be mechanically clamped to the heat generating components 422. A specific type of heat sink is not required to be utilized with the cooling system of the present invention, but rather, any suitable type of heat sink may be employed. For example, one skilled in the art would readily recognize that a plurality of variously configured heat sinks may be employed with the exemplary embodiment of the present invention without deviating from the scope thereof.

In any event, the second ends of some of the nozzles 418 located generally away from the plena 416, 430 terminate at a substantially close distance to each of the components 422 and 448. Alternatively, some of the components 448 may be positioned generally behind a heat generating component 422 to thereby receive supplemental fluid flow directed at the heat generating component 422. The distance between the second ends and the heat sinks 446 and/or the components 448 may be determined based upon testing to optimize the heat transfer from the heat sinks and/or the components into the cooling fluid. In one respect, the distance may be set such that the impinging zone of the fluid flow is substantially directly located within the area of the heat sinks 446 and/or the components 448 to thereby increase the potential for maximum heat transfer. Because the fluid from the nozzles 418 generally flows into the fluid located substantially adjacent to the components 422, 448, the flow is considered as being submerged. The fluid flow from the nozzles 418 thus mixes with the adjacent fluid, thereby causing the fluid flow to expand. The mixing of the fluid causes the flow rate of the fluid from the nozzles 418 to generally increase, however, the maximum velocity of the fluid from the nozzles generally decreases. There is thus a relatively optimum distance where the second ends of the nozzles 418 may be positioned with respect to the components 422, 448 to maximize both flow rate and velocity of the fluid from the nozzles.

Figure 7:
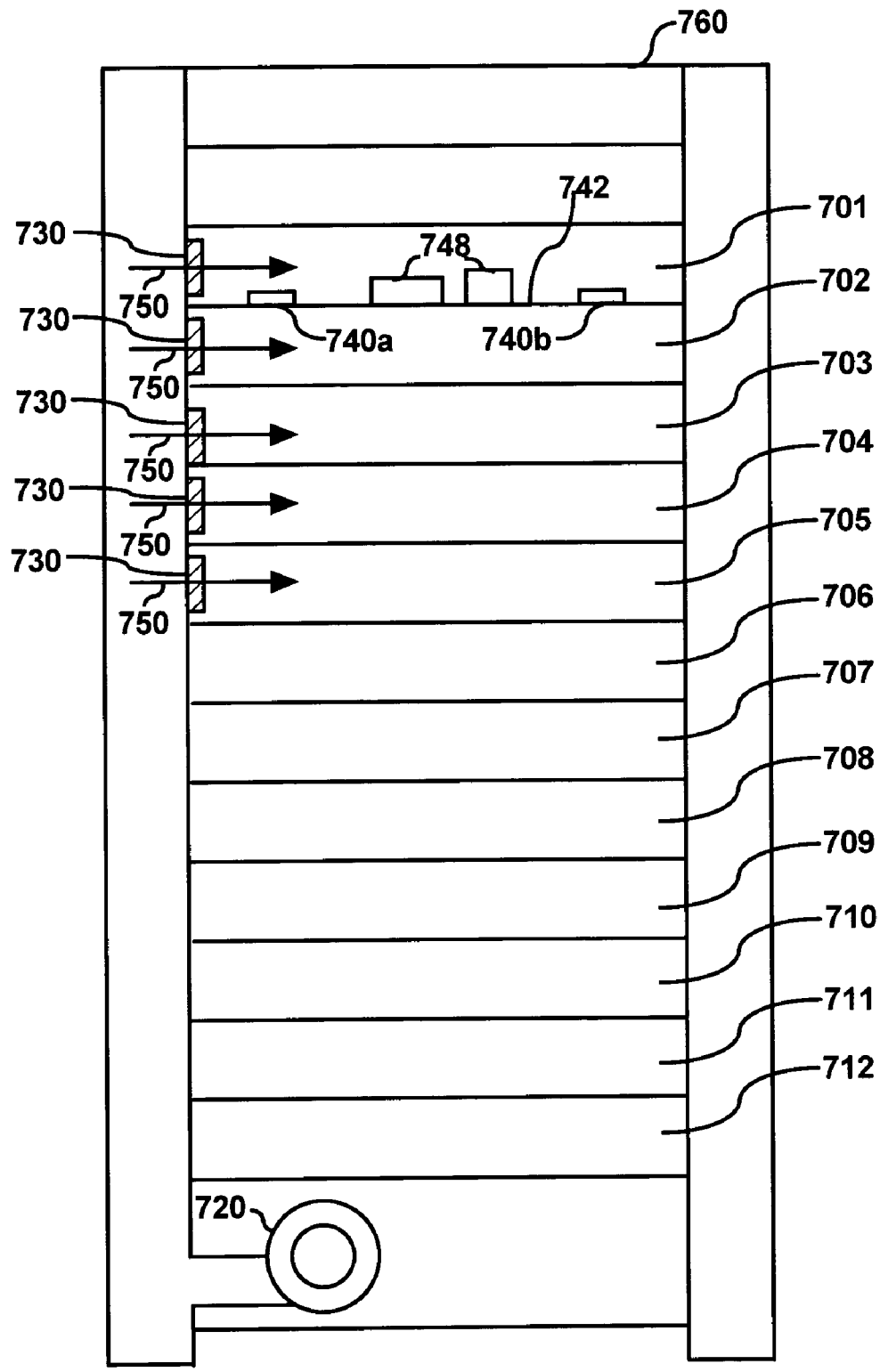
FIG. 7 illustrates another rack system, according to an embodiment of the invention.

According to an exemplary embodiment, the controller 460 is operable to manipulate the valves 442 to thereby control the flow of fluid through each of the nozzles 418. The controller 460 may manipulate the valves 442 based upon the actual temperature of each of the heat generating components 422, 448 or through an anticipated temperature of each of the components. The actual temperature of the heat generating components 422, 448 may be determined by a temperature sensor/heat sensor, e.g., thermocouple, thermistor, etc., located on or near the heat generating component 422, 448 or the heat sink 446. For example, the temperature sensor may be integrally formed with the heat generating component 422, 448, the heat sink 446, or the temperature sensor may be attached on the heat generating component or the heat sink. A temperature sensor 470 is shown as being integral with one of the components 422. Although not shown, other components 422 may include a temperature sensor integrally formed or in proximity with respective components. For example, the temperature sensor 470 may be connected to the enclosure 412 in proximity to one or more components to detect heat dissipation of the computer systems 420. Also, the temperature sensors may be located at air inlets and air outlets to measure heat dissipation, such as shown in FIG. 7 and described in detail with respect to FIG. 7. For example, a temperature sensor may be placed near a nozzle, such as in proximity to where the air exits the nozzle. Also, a temperature sensor may be placed at an air outlet, such as where the air exits the computer system. The anticipated temperature of the heat generating components 422, 448 may be predicated upon an impending load on the heat generating component. For example, the controller 460 may anticipate the heat load the components 422, 448 will dissipate based on historical workload and temperature measurements. The controller 460 may then manipulate the valves 442 according to the anticipated load.

In any event, if there is an actual change or an anticipated change in the temperature of the respective heat generating components 422, 448, the controller 460 generally operates to manipulate the corresponding valve 442 to compensate, i.e., changes the flow rate of the cooling fluid, for the change in temperature. In this respect, each of the components 422, 448 generally receives substantially the amount of cooling fluid necessary to maintain the temperature of the components 422, 448 within a predetermined temperature range. As will be seen from the discussion herein below, by controlling the cooling fluid flow in this manner, the blowers 414 may be operated at a substantially optimized level, thereby decreasing the amount of energy and thus the operating costs required to operate the blowers 414.

The amount of cooling fluid the blowers 414 deliver to the plena 416, 430 may also be controlled by the controller 460. The controller 460 may control the speed, and thus the fluid intake, of the blowers 414 in a variety of different manners. By way of example, the controller 460 may control the speed of the blowers 414 by adjusting the amount of power supplied to the blowers. Alternatively, the controller 460 may adjust the speed of the blowers 414 in any manner generally known to those skilled in the art. In any respect, the controller 460 may operate to manipulate the blowers 414 in response to a variety of factors. By way of example, the speed of the blowers 414 may be manipulated, e.g., either increased or decreased, in response to manipulation of the valves 442, e.g., to increase or decrease the flow rate of the cooling fluid.

As another example, the controller 460 may operate to manipulate the speed of the blowers 414 in response to changes in pressure within the plena 416, 430. In this instance, a pressure sensor 452 may be situated either at one location or at various locations within the plena 416, 430. The measurements obtained by the pressure sensor 452 may be relayed to the controllers 460. The controller 460 may detect any discernible change in the pressure of the fluid located within the plena 416, 430 and alter the blower speed accordingly. For example, if the pressure sensor 452 measures a change in the pressure, or alternatively, if the pressure sensor detects a predetermined degree of pressure change, the controller 460 may control the blowers 414 to alter their speeds. In this respect, the amount of energy expended to supply the heat generating components 422, 448 with cooling fluid is substantially optimized. Therefore, only that amount of energy required to substantially cool the heat generating components 422, 448 is expended, which correlates to a substantial energy savings over known cooling systems.

As described above, the controller 460 may be connected to heat sensors and/or pressure sensors to dynamically providing cooling. For example, the controller 460 may be connected to heat sensors (not shown) monitoring heat dissipation of the components 422, 448 of the computer systems 420. The controller 460 periodically determines the heat dissipation of each of the computer systems 420 at any one instance. The controller 460 controls the valves 442 and the blowers 414 to distribute cooling fluid based on heat dissipation. Also, if the heat dissipation exceeds a threshold (related to the maximum cooling capacity of the cooling system), then the controller 460 may instruct one of the computer systems 420 to temporarily shut down. Alternatively, the controller 460 may communicate with the computer systems 420 to place one or more components 422, 448 in a lower-power state to reduce heat dissipation. According to an embodiment, the controller 460 may instruct a system controller of one of the computer systems 420 to place one or more components 422, 448 in a lower-power state. If necessary, the controller 460 may communicate with a workload manager/central controller (not shown) for the computer systems 420 to distribute the workload of the computer system being shut down to other computer systems 420 that will continue to operate. These and other techniques, such as described in co-pending application number 10/608,206 incorporated by reference above, for placing components/computer systems in a lower-power state may be used. When one or more computer systems/components are placed in a lower-power state, cooling may be reduced for those systems/components. The cooling, instead, may be distributed to the computer systems 420 that are continuing to function. By reducing heat dissipation for the rack system 410, the controller 460 substantially prevents the heat dissipation of the computer systems 420 from exceeding the cooling capacity of the cooling system. Thereby, sufficient cooling may substantially always be available for cooling the computer systems 420.

The controller 460 may execute one or more of the modules (e.g., heat detection module 230, threshold comparison module 220, lower-power state module 222, workload module 228, etc.) for placing computer systems/components in a lower-power state when the threshold is exceeded. In addition, one or more of the functions of the controller 460 may be executed by one or more controllers provided in one or more locations. Also, the controller 460 may be located remotely from the rack system 410 or at other locations in the rack system 410.

The rack system 410 may include controllable components, other than the nozzles 418 and valves 442, for provisioning cooling fluid to the components 422. For example, instead of the nozzles 418, controllable louvers may be used to control air flow to components 422 based on heat dissipation.

Figure 6A:
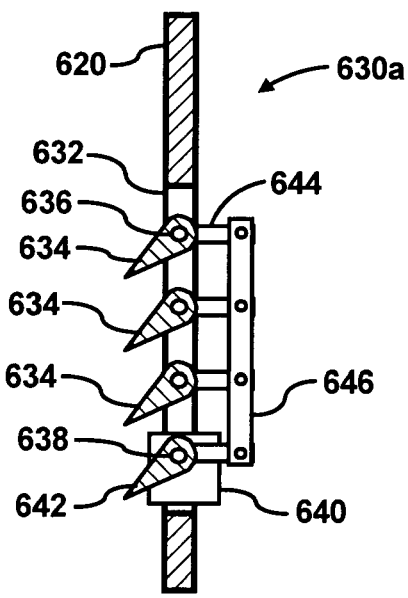
FIGS. 6A-C illustrate louver systems, according to embodiments of the invention.
Figure 6B:
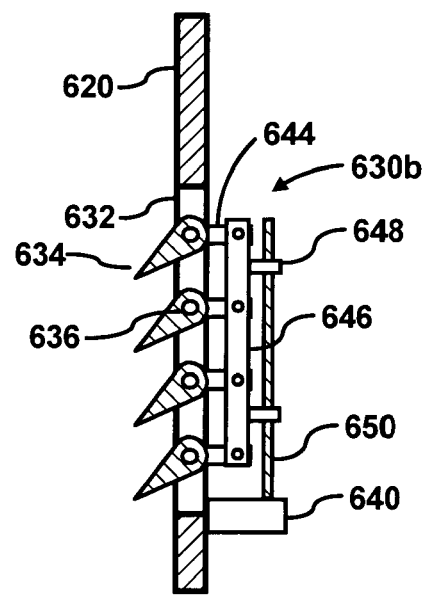
Figure 6C:
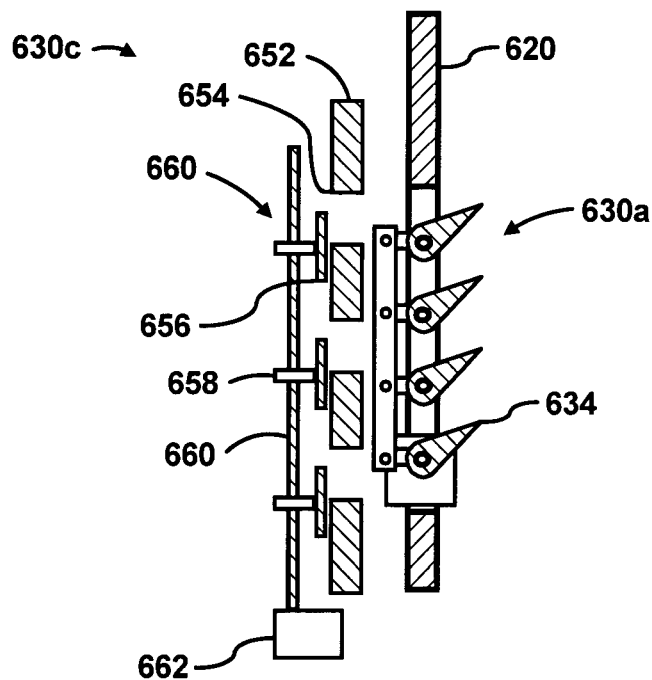

With reference to FIGS. 6A-C, there are shown cross-sectional side views of respective louver assemblies 630a, 630b, 630c for varying the airflow through openings 632 in a ventilated panel 620, according to various embodiments of the invention. The ventilated panel 620, for example, may be positioned similarly to the nozzles 418, shown in FIGS. 4 and 5, to control air flow to the components 422. It should be readily apparent to those of ordinary skill in the art that the embodiments of the louver assemblies 630a, 630b, 630c depicted in FIGS. 6A-6C represent generalized illustrations and that other louver assembly configurations may be implemented without departing from the scope of the invention. For example, the louvers may comprise generally rectangular or other known configurations and the actuating devices may comprise a belt driven assembly, geared assembly, or other known mechanisms for moving the louvers. In addition, it should be understood that the number of louvers shown in FIGS. 6A-6C is for illustrative purposes only and is not meant to limit the invention in any respect.

As illustrated in FIG. 6A, the louver assembly 630a is positioned around an opening 632 of the ventilated panel 620. The louver assembly 630a includes slats 634 pivotally attached to the sides of the opening 632 via pivoting members 636. A primary pivoting member 638, e.g., a drive shaft, may be attached and rotated by an actuator 640, e.g., a direct current (DC) motor or the like. The actuator 640 may be rigidly attached to the ventilated panel 620 in any suitable manner. The primary pivoting member 638 may also be rigidly attached to a primary slat 642 configured to rotate as the actuator 640 rotates the primary pivoting member 638. One end of a plurality of linkage members 644 may be rigidly attached to the slats 634 and to the primary slat 642. The other ends of the linkage members 644 may be pivotally attached to a transfer member 646. Thus, rotation of the primary slat 642 causes the transfer bar 646 to translate, thereby causing the slats 634 to pivot about their pivoting members 636.

In FIG. 6B, the louver assembly 630b is illustrated as being located around an opening 632 of the ventilated opening 632. The louver assembly 630b includes slats 634 pivotally attached to the sides of the opening 632 via pivoting members 636. The slats 634 are rigidly connected to ends of linkage members 644. The opposite ends of the linkage members 644 are pivotally attached to a transfer member 646. Attached to the transfer member 646 are drive links 648 having threaded holes (not shown) through which a threaded drive shaft 650 extends. The threaded drive shaft 650 is threadably coupled to the threaded hole of the drive links 648. Thus, rotation of the threaded drive shaft 650 generally causes the drive links 648 to traverse in a direction perpendicular to the threaded drive shaft 650. The threaded drive shaft 650 may be rigidly attached to an actuator 640, e.g., a DC motor or the like. The actuator 640 may thus rotate the threaded drive shaft 650 to generally cause the transfer member 646 to translate thereby causing the slats 634 to rotate about their respective pivoting members 636.

FIG. 6C illustrates a louver assembly 630c designed to provide a greater level of control over the volume flow rate and direction of airflow through the opening 632 in the ventilated panel 620 as compared with the louver assemblies 630a and 630b. As illustrated in FIG. 6C, the louver assembly 630c includes the louver assembly 630a and a venting system 600. It should be understood, however, that the louver assembly 630c may comprise the configuration of the louver assembly 630b to manipulate the slats 634 without departing from the scope of the invention.

The venting system of the louver assembly 630c includes a stationary vane plate 652 comprising a plurality of plate openings 654. The stationary vane plate 652 may be rigidly or removably attached to the ventilated panel 20 to generally enable the slats 634 to rotate relatively freely. In addition, the louver assembly 630c includes a plurality of movable vane plates 656 sized to substantially cover respective plate openings 654. The movable vane plates 656 are illustrated as being rigidly attached to respective drive links 658. The drive links 658 are similar to the drive links described with respect to FIG. 6B. Thus, the drive links 658 include threaded holes (not shown) through which a threaded drive screw 660 extends. The threaded drive screw 660 is threadably mated with the threaded holes to cause the drive links 650 to translate perpendicularly when the threaded drive screw 660 rotates. The threaded drive screw 660 is coupled to a drive member 662, e.g., a DC motor or the like, such that the drive member 662 may cause rotation of the threaded drive screw 660. Rotation of the drive screw 660 results in translation of the movable vane plates 656 to thereby vary the airflow through the plate openings 654 and through the opening 632 of the ventilated panel 620.

The drive member 662 may be suspended from the stationary vane plate 652 to maintain the sliding relationship between the stationary vane plate 652 and the movable vane plates 656. One of ordinary skill in the art will recognize that the drive member 662 may be suspended by a metal bracket, zip tie, adhesive, or other attachment arrangements (not shown). Although drive links 658 are shown as individually coupling the movable vane plates 656 with the drive screw 660, it is within the purview of the invention that a drive link 658 may be attached to one of the movable vane plates 656 while that movable vane plate 656 is attached to the other movable vane plates 656.

The actuators 40 (FIGS. 6A-B) and the drive member 62 (FIG. 6C) control the movement of the louvers 34 to allow more or less air flow to reach the components 522 of the computer systems 20 (FIG. 5). Similarly to controlling the valves 542, the controller 44 (FIG. 6) may control an actuator or a drive member to provision cooling fluid (e.g., air) to the components 522 based on heat dissipation.

FIG. 7 illustrates another embodiment of a storage and cooling rack system. In this embodiment, a blower and/or fans may be used to cool each computer system in a rack. FIG. 7 illustrates a cross section of a rack system 700. The rack system 700 includes an enclosure 760 with slots (also referred to as shelves or bays) 701-712. Twelve slots are shown for illustrative purposes, however, the rack system 700 may be capable of storing up to forty or more computer systems. Each of the slots 701-712 may support one or more computer systems. For example, a computer system, such as a system board or a box server may be located in a slot, or multiple computer systems, such as multiple blade servers, may be located in a slot. A computer system 742 comprising a system board with components 748 and temperature sensors 740a and 740b is shown as being mounted in slot 701. Similarly, computer systems may be mounted in slots 702-712.

The cooling system components for the rack system 700 include at least one blower 720 and fans 730. The blower 720 may receive cool air from below the enclosure 760 and distribute the cool air to the slots 701-712 using the fans 730. The arrows 750 show the direction of travel of the cool air across the slots 701-705. The cool air is heated by the heat dissipated from the components of the computer systems mounted in the slots 701-712, and the heated air exits, for example, the rear of the rack system 700. It will be apparent to one of ordinary skill in the art that the fans 730 and the blower 720 may be positioned at other locations in the enclosure 712. Furthermore, the cooling system may be designed such that the heated air exits the rack system 700 from locations other than the rear (e.g., the top, side, bottom, etc.). Although not shown, fans 730 may be used for the slots 706-712. Also, instead of or in addition to the fans 730, louvers, such as the louvers 634 shown in FIG. 6, may be used to control air flow to the slots 701-712.

Temperature sensors 740a and 740b are shown for measuring the heat dissipation of the computer system 742. The temperature sensors 740a and 740b are shown as being placed near an air inlet and an air outlet for the computer system 742. For example, the temperature sensors 740a and 740b measure temperature at the air inlet and the air outlet of the computer system 742 respectively. The difference between the temperature sensed by sensors 740b and 740a is a measure of the heat dissipated by the computer system 742. In other embodiments, temperature sensors may be placed in different locations (e.g., in proximity to heat generating components) to determine heat dissipation. Also, temperature sensors for any computer system mounted in the slots 701-712 may be placed in proximity to the air inlets and the air outlets, such that heat dissipation for each computer system mounted in the enclosure 712 may be determined.

A controller (not shown) can be used to provision cooling fluid (e.g., air) to the slots 701-712 based on heat dissipation of each computer system mounted in the slots 701-712. The controller may be similar to the controller 460 shown in FIG. 5. In one embodiment, the controller controls the speed of the fans 730 or movement of louvers to provide more or less air flow depending on the amount of heat being dissipated.

Also, the cooling system components may be designed based on nominal heat dissipation of the computer systems mounted in the slots 701-712. For example, the size of the blower 720 selected to be implemented in the rack system 700 may be based on nominal heat dissipation rather than maximum heat dissipation of the computer systems housed in the rack system. If 100 cfm of air flow is needed, based on nominal heat dissipation, to cool each of twelve computer systems mounted in the slots 701-712 respectively, then the blower 720 is selected or designed to produce at least 1200 cfm of air flow. As described above, the cooling system provisions cooling fluid based on the amount of heat being dissipated by computer systems mounted in the slots 701-712. Table 1 illustrates exemplary air flow providing to the slots 701-712 for a cooling system nominally designed to produce 1200 cfm of air flow.

TABLE I

| SLOT | CFM |
|---|---|
| 701 | 125 |
| 702 | 125 |
| 703 | 125 |
| 704 | 125 |
| 705 | 125 |
| 706 | 125 |
| 707 | 75 |
| 708 | 75 |
| 709 | 150 |
| 710 | 150 |
| 711 | 0 |
| 712 | 0 |

As shown in Table 1, slots 701-706 receive 125 cfm of air flow, because computer systems mounted in those slots are dissipating 25% more heat above nominal heat dissipation (100 cfm). Similarly, slots 707-708 receive 75 cfm of air flow, and slots 709-710 receive 150 cfm of air flow based on the measured heat dissipation of computer systems mounted in the respective slots. Slots 711-712 receive substantially no cooling fluid. Computer systems mounted in the slots 711-712, for example, may have been placed in a lower-power state by a cooling provisioning system (e.g., the cooling provisioning system 106 shown in FIG. 2) to allow a sufficient amount of cooling fluid to be available for computer systems mounted in the remaining slots 701-710. Louvers and/or fan speed may be used to dynamically distribute cooling fluid to the slots 701-712 based on heat dissipation sensed using temperature sensors, such as the temperature sensors 740a and 740b. An amount of cooling fluid distributed to each of the slots 701-712 may be substantially proportional to an amount of heat being dissipated by computer systems mounted in the slots 701-712.

Figure 8:
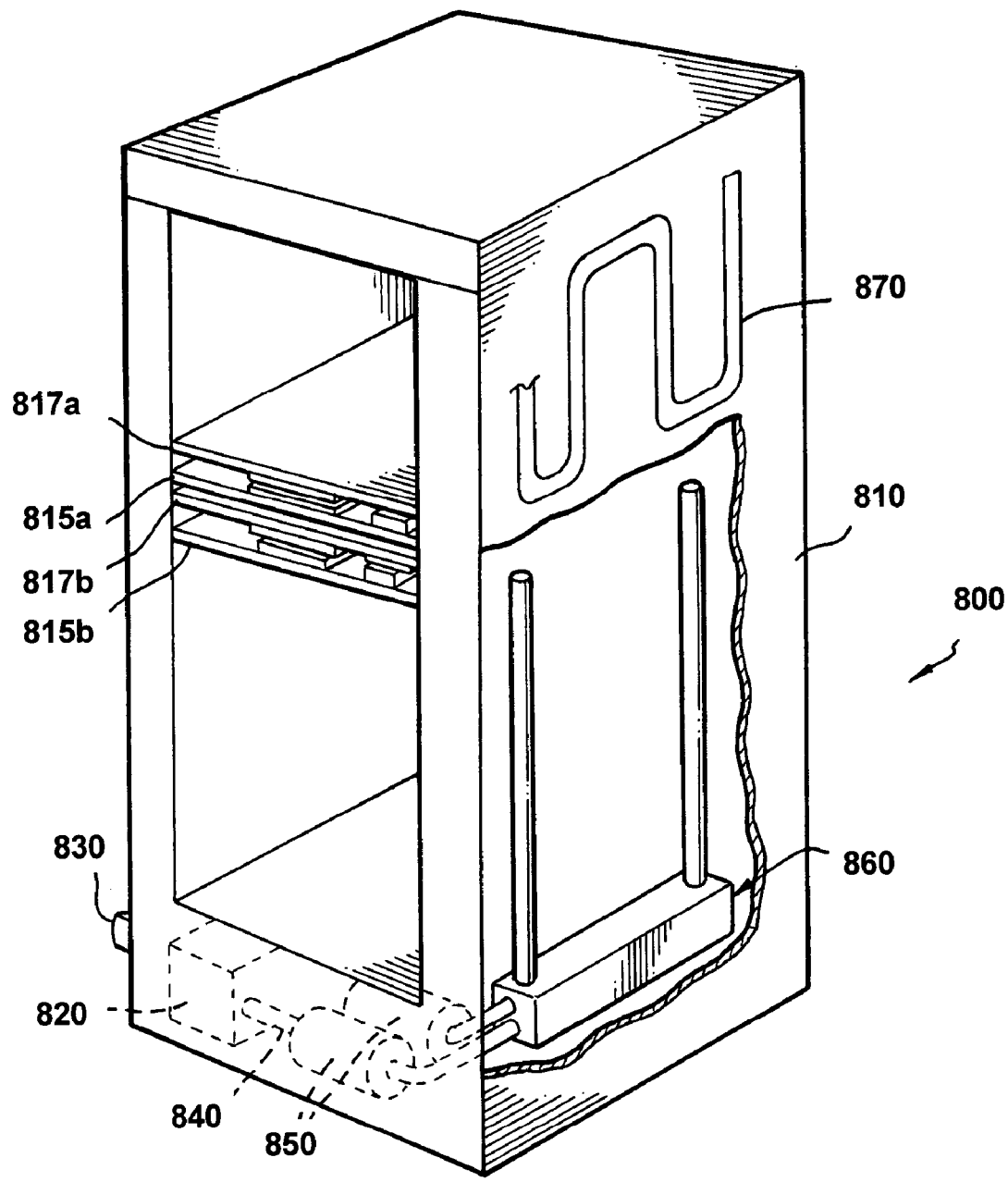
FIG. 8 illustrates yet another rack system, according to an embodiment of the invention.

FIG. 8 illustrates yet another embodiment of the storage and cooling rack system. This embodiment employs a coolant-based cooling system using, for example, pumps and valves, to dynamically distribute cooling based on heat dissipation. This embodiment is described in detail below and is described in co-pending and commonly assigned U.S. patent application Ser. No. 10/062,443, entitled, "Method and Apparatus for Cooling Heat Generating Components", which is hereby incorporated by reference in its entirety. FIG. 8 shows a perspective view of the rack system 800. A housing 810 serves to house a plurality of computer systems (e.g., system boards 815a and 815b). Although only two boards are depicted, it should be appreciated that the rack system 800 may house many boards. In addition to system boards, computer systems enclosed in a box may be housed and cooled in the rack system 800 or any of the rack systems disclosed herein. Each system board 815a and 815b is provided with at least one actuated cell 817a and 817b. Each actuated cell 817a and 817b is configured to provide cooling for the components on one or more system boards 815a and 815b.

The rack system 800 provides cooling for the system boards, as well as electrical connectivity. The rack system 800 also provides for management of the cooling (i.e., dynamic cooling based on heat dissipation) so as to avoid wasted energy. Thus, the rack system 800 may include internal monitoring components to ensure that the system does not over or under cool.

The rack system 800 may includes one or more temperature sensors connected to a controller, not shown. The controller monitors the heat dissipated by the system boards 815a and 815b using the temperature sensors and controls the cooling system accordingly. The rack system 800 may lower the flow of liquid within the system, for instance using one or more of the valves, or slowing the operation of the pump to reduce cooling to a particular system board in response to the system board dissipating less heat. Alternatively, the rack system 800 may lower the cooling of liquid flowing through the system, by modulating the operation of the heat exchanger 820 used to withdraw heat from the liquid flowing through the system. Thus, the heat extraction may be based on the needs of the boards 815a and 815b being serviced by the rack system 800, and the capacity of the heat exchanger 540 at any given time should approximate the cooling needs of the system 800.

The temperature sensors may include a temperature gauge connected to a fluid supply line or connected to another component of the cooling system 10. For instance the temperature gauge may be connected to a cold plate, or it may be included within or as part of a liquid reservoir.

The embodiment depicted in FIG. 8 includes a liquid to liquid heat exchanger 820. This heat exchanger 820 is connected to a chilled water supply 830, and may include a valve (not shown). The valve enables control over the flow of chilled water from the chilled water supply 830 through the heat exchanger 820. The heat exchanger 820 puts the chilled water from the chilled water supply 830 in thermal communication with a liquid in the rack system 800.

The liquid in the rack system 800 travels through a supply line 840. In the embodiment shown, the supply line connects the liquid to liquid heat exchanger 820 to a plurality of redundant pumps 850. These pumps 850 are used to push the liquid from a reservoir 860 into the liquid to liquid heat exchanger 820 and out into the system 800. The reservoir 860 serves to help ensure that the pumps 850 have sufficient liquid. In this regard, it may be noted that the reservoir 860 is positioned vertically higher than the pumps 850. From the liquid to liquid heat exchanger 820, the liquid travels within the housing 810 to the actuated cells 817a and 817b. The actuated cells 817a and 817b transfer heat from the computer boards 815a and 815b to the liquid traveling through the rack system 800. The liquid then returns to the reservoir 860, travels through the pumps 850, and then on to the liquid to liquid heat exchanger 820, where the liquid's heat is transferred to the water in the chilled water supply 830. In one embodiment, the liquid is a mixture of ethylene glycol and water, mixed in a predetermined ratio, or some other suitable liquid selected for its heat absorbance and transfer characteristics, and/or its non-corrosive characteristics.

The housing 810 may be constructed with roll bond sides 870. The roll bond sides serve to further cool the apparatus, as described in U.S. Pat. No. 6,115,251, the teachings of which are incorporated herein by reference. In one embodiment, the roll bond sides 870 are an external panel formed from two sheets bonded together to define a sealed fluid channel there between, such that the liquid traveling through the supply line 840 and into the actuated cells 817a and 817b may also travel through the roll bond sides 870 and thereby further extract heat from the system 800. In one embodiment, the liquid in the supply line 840 travels directly from the heat exchanger 820 to the actuated cells 817a and 817b as previously described, and then through the roll bond sides 870. In another embodiment, the liquid in the supply line 840 travels directly from the heat exchanger 820, through the roll bond sides 870, then on to the actuated cells 817a and 817b, as previously described.

As described above, the cooling system may be designed based on the nominal heat dissipation of the system boards enclosed in the rack system 800 rather than a maximum heat dissipation of the system boards. The rack system 800 may also include the functionality of the controller 60 of FIG. 5. That is the rack system 800 may also monitor the aggregate heat dissipation of the system boards 815a and 815b. If the aggregate heat dissipation exceeds a threshold (related to the maximum cooling capacity of the cooling system), then one or more of the system boards 815a and 815b or components thereon may be placed in a lower-power state. Thereby the heat dissipation of the system boards 315a and 315b is substantially prevented from exceeding the maximum cooling capacity of the cooling system for the rack system 800.

Figure 9:
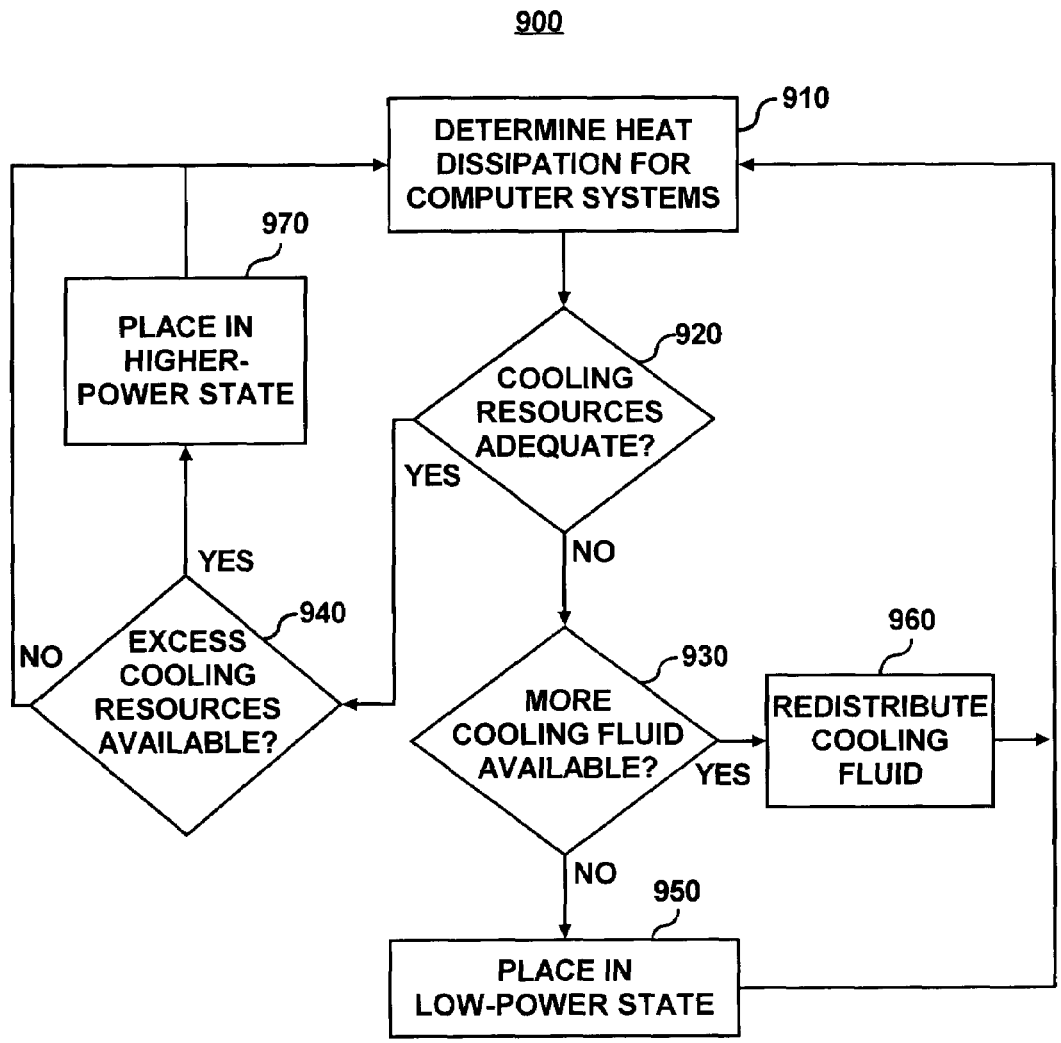
FIG. 9 is a flowchart illustrating a method for dynamically cooling one or more computer systems, according to an embodiment of the invention.

FIG. 9 illustrates a method 900 for providing dynamic cooling, according to an embodiment of the invention. The steps of the method 900 are applicable to almost any type of computer system, including the rack systems shown in FIGS. 4-8. Furthermore, the steps of the method 900 may be performed by software, hardware or a combination thereof. The steps of the method 900 are described below generally with respect to the system 200 shown in FIG. 2 by way of example and not limitation. Furthermore, the steps of the method 900 are applicable to many types of multi-computer systems utilizing a cooling system, which may be designed based on nominal heat dissipation. The method 900 may be applied to conventional cooling systems as well (e.g., designed based on maximum heat dissipation), which may improve the efficiency of the conventional cooling systems.

At step 910, the cooling provisioning system 106 determines heat dissipation for the computer systems 110. For example, heat dissipation may be determined from power, as power into a computer system is approximately equal to heat dissipated by the computer system. The temperature sensors may be used to determine heat dissipation. Temperature sensors may be placed at an air inlet and air outlet to measure the rise in temperature (Tout−Tin) for determining mass flow rate of the cooling fluid for given heat dissipation by the computer system. Temperature sensors may also be placed in proximity with components or integrally formed with components for determining heat dissipation. Heat dissipation may also be estimated from historical measurements.

At step 920, the cooling provisioning system 106 determines whether an adequate amount of cooling fluid is being provided (e.g., measured as mass per unit time or volume per unit time (CFM)) to cool the computer systems 110 based on the heat dissipation of the computer systems 110 as determined at step 910. Mass flow per unit time can be calculated using equation (1) $Q=\dot{m}C_p(Tout-Tin)$. Further, equation (2), a simplified equation to calculate volume flow per unit time for air at sea level, can be used to determine volume flow needed in cubic feet per minute. Equation 2 is determined from equation (1) by substituting values for density of air, specific heat capacity of air.

$$V=1.8Q/(Tout-Tin) \qquad \text{Equation (2)}$$

V is the volumetric air flow (cfm, cubic feet per minute) needed to cool the heat dissipation Q. Tout−Tin may be measured, for example, by using temperature sensors at an air inlet and air outlet, or estimated (e.g., 15 degrees Celsius). As an example, if the heat dissipation is 1100 W, using equation (2), 132 cfm of air flow needs to be distributed to the computer system 110 dissipating 1100 W. The heat dissipation for each of the computer systems 110 may be summed to determine the amount of cooling fluid needed to cool the computer systems 110. The heat dissipation (Q) in Watts is substantially equal to the input power of the computer systems 110. Typically, the majority of the power input to a computer system is dissipated in heat, while a minimal amount of the power is actually used to power the components of the computer system. The amount of cooling fluid can be determined based on previous measurements of temperature difference. Also, by substituting the mass flow rate of liquid and specific heat capacity of liquid at sea level in equation (1), mass and volumetric liquid flow for a liquid-cooled system, such as shown in FIG. 8, may be calculated.

If more cooling is needed to cool the computer systems 110, as determined at step 920, the cooling provisioning system 106 determines whether more cooling fluid is available (step 930). For example, the cooling provisioning system 106 may compare the current cooling capacity (e.g., amount of cooling fluid being provided) of the cooling system with a threshold associated with the maximum capacity of the cooling system. If the threshold is exceeded, no more cooling fluid is available. Regarding the threshold, if, for example, the maximum cooling capacity is 10 kW, then the threshold may be set at 9.5 kW. The threshold may also be based on a rate of heat dissipation, which may be used in combination with a maximum cooling capacity threshold. For example, if the current cooling capacity is 9 kW, but the rate of heat dissipation is relatively steep, the cooling provisioning system 106 may determine that no more cooling fluid is available.

If the cooling provisioning system 106 determines no more cooling fluid is available, as determined at step 930, one or more components may be placed in a lower-power state to reduce heat dissipation (step 950). For example, a processor's speed may be reduced, a memory system may reduce power consumption be shutting down a cache or redundant drive, an entire computer system may be shut down, etc. In one embodiment, the cooling provisioning system 106 may generate a request to the lower-power state module/power provisioning system to place one or more components in a lower-power state. The cooling provisioning system 106 may generate multiple requests until the heat dissipation of the computer system 110 is sufficiently reduced, such that a necessary amount of cooling fluid can be provided to the computer system or component. Also, certain components, such as processors, may be placed in multiple lower-power states. A processor, for example, may be operable to reduce its clock speed to multiple different, lower clock speeds. The clock speed may be reduced until the power consumption of the processor is adequately reduced. Alternatively, some processors may include power management software, whereby the cooling provisioning system 106 or a power provisioning system may instruct the processor not to consume more than a certain amount of power.

If the cooling provisioning system 106 determines more cooling fluid is available, as determined at step 930, the cooling provisioning system 106 redistributes cooling fluid to the computer systems 110 while providing more cooling fluid to the computer system or component with increased heat dissipation (step 960). The cooling provisioning system 106 dynamically distributes cooling fluid based on heat dissipation or workload using, for example, the cooling system components 102. For example, a blower or fan speed may be varied, louvers may be adjusted, more refrigerant may be directed to the computer system/component, etc.

At step 920, if the cooling provisioning system 106 determines that the computer systems 110 are being adequately cooled, the cooling provisioning system 106 determines whether excess cooling resources are available (step 940). For example, the cooling provisioning system 106 compares the amount of cooling fluid being provided to the computer systems 110 to a threshold, such as the excess cooling fluid threshold described above. This comparison is done after applying averaging or other trend-discovery algorithms to the current cooling load so as to avoid reacting to instantaneous changes in the cooling needs and to provide the environmental conditions sufficient time to stabilize following a previous change. The threshold is determined, such that the cooling provisioning system does not continually change the operating state of components if a minimal amount of cooling fluid operable to be generated by the cooling system is not being used. The threshold is further determined by selecting a value that is sufficiently low that at least one component can be placed in a higher-power state without causing the maximum capacity related threshold to be immediately exceeded. If the amount of cooling fluid is below the threshold, then excess cooling resources are available. Therefore, at step 970, the cooling provisioning system 106 or a power provisioning system places one or more components, currently in a lower-power state, into a higher-power state (resulting in increased heat dissipation to be cooled by the excess cooling resources). Increasing the amount of power available to a component generally results in better performance, such as increasing the clock speed of a processor or making more caches available. The steps of the method 900 may be performed for each computer system or component that has cooling fluid directed thereto by the cooling provisioning system 106.

Figure 10:
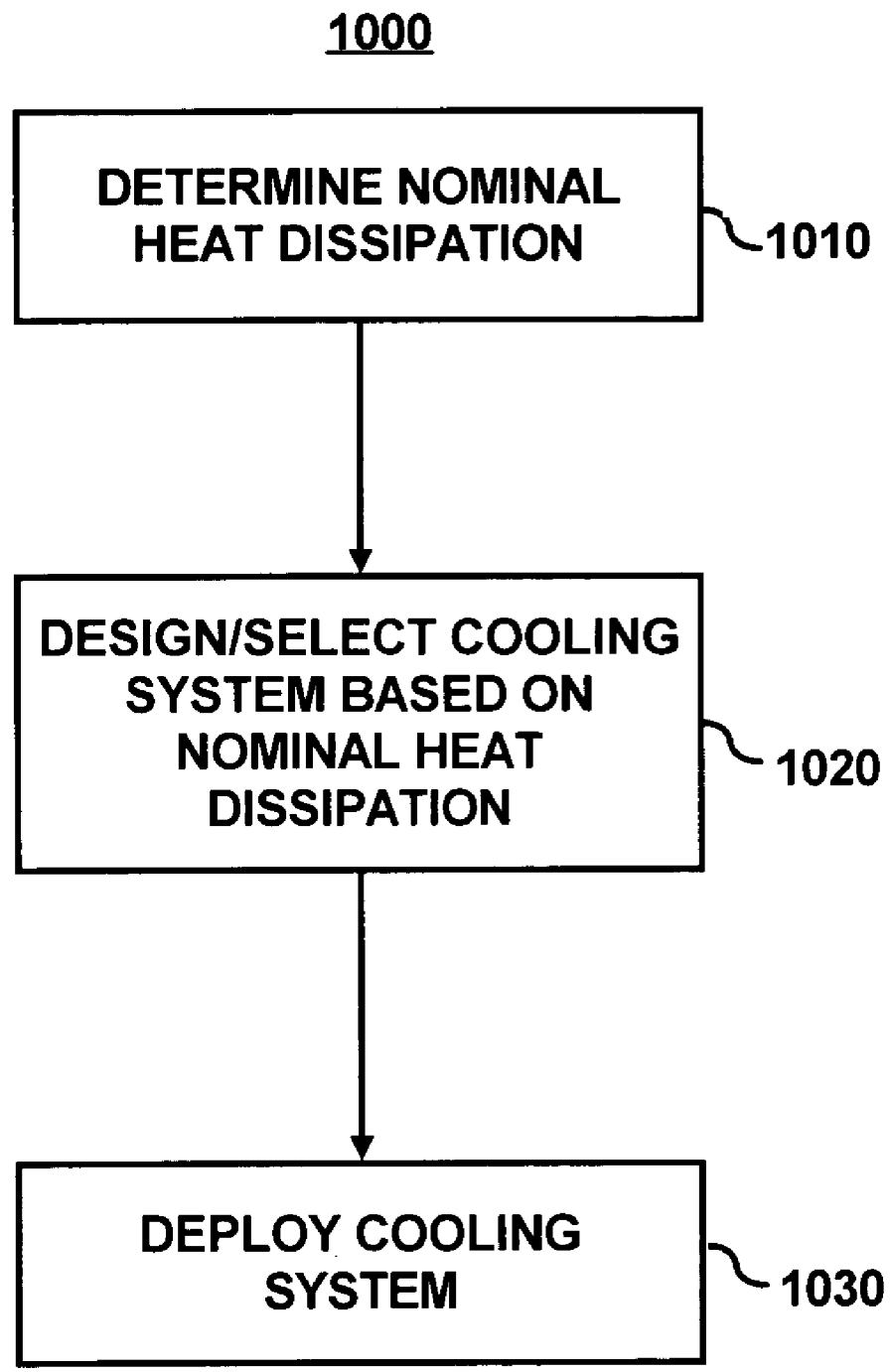
FIG. 10 is a flowchart of a method for designing a cooling system, according to an embodiment of the invention.

FIG. 10 illustrates a flow chart of a method 1000 for designing a cooling system based on nominal power consumption, according to an embodiment of the invention. At step 1010 a nominal heat dissipation of the computer system(s) being cooled is determined.

At step 1020, a cooling system is designed or selected that is operable to cool the computer system(s) based on the nominal heat dissipation. For example, a cooling system may be designed that operates efficiently while dissipating the determined nominal heat dissipation. A cooling system may be designed such that the maximum capacity of the cooling system is proximate the nominal heat dissipation, which may lower manufacturing costs and conserve energy. At step 1030, the cooling system is deployed for cooling the computer system(s).

What has been described and illustrated herein are embodiments of the invention along with some of variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A cooling system for cooling computer systems, the cooling system comprising:
   temperature sensors operable to detect heat dissipated by the computer systems;
   cooling components distributing cooling fluid to the computer systems;
   at least one circuit operable to determine an aggregate amount of heat dissipated by the computer systems from the temperature sensors and compare the aggregate amount of heat being dissipated by the computer systems to a threshold, wherein the threshold is based on a maximum cooling capacity of the cooling system, wherein the cooling system is designed to cool the computer systems based on a nominal heat dissipation of the computer systems, and the nominal heat dissipation is less than a maximum heat dissipation of the computer systems,
   wherein the at least one circuit is operable to place at least one electrical component of the computer systems in a lower-power state to reduce heat dissipation in response to the amount of heat being dissipated by the computer systems exceeding the threshold; and
   the at least one circuit is further operable to compare an amount of cooling fluid being provided to cool the computer systems to an excess cooling threshold to determine if excess cooling fluid is available, and place one or more electrical components of the computer systems in a higher-power state from a lower-power state if excess cooling fluid is available.

2. The cooling system of claim 1, wherein the lower-power state comprises reducing power consumption of one or more electrical components in the computer systems.

3. The cooling System of claim 1, wherein the maximum cooling capacity of the cooling system is based on an aggregate of the nominal heat dissipation of each of the computer systems.

4. The cooling system of claim 1, wherein the nominal heat dissipation is based on an average heat dissipation of the electrical components.

5. The cooling system of claim 1, wherein the at least one circuit controls the cooling components to distribute the cooling fluid as a function of the heat dissipated by the computer systems.

6. The cooling system of claim 5, wherein an amount of cooling fluid distributed to at least one of the computer systems is substantially proportional to an amount of heat being dissipated by the at least one of the computer systems.

7. The cooling system of claim 5, wherein the cooling components comprise one or more of a valve, valve controller, blower, pump, louvers, actuated cells, and cooling plates.

8. The cooling system of claim 5, wherein the cooling fluid comprises at least one of air and liquid coolant.

9. The cooling system of claim 5, wherein the at least one circuit is operable to control at least one of valves and louvers to control air flow for cooling the computer systems based on the amount of heat being dissipated by the computer systems.

10. The cooling system of claim 5, wherein the at least one circuit is operable to control at least one of valves and a pump to distribute coolant for cooling the computer systems based on the amount of heat being dissipated by the computer systems.

11. The computer system of claim 1, wherein the at least one circuit controls the cooling components to distribute the cooling fluid as a function of workload for the computer systems.

12. An apparatus for controlling cooling of computer systems comprising:
   means for distributing cooling fluid to the computer systems;
   means for determining an aggregate amount of heat dissipated by the computer systems;
   means for comparing the aggregate amount of heat being dissipated by the computer systems to a threshold based on a maximum cooling capacity of the cooling system, wherein the maximum cooling capacity of the cooling system is based on a nominal heat dissipation of the computer systems, the nominal heat dissipation being less than a maximum heat dissipation of the computer systems;
   means for placing at least one electrical component in the computer systems in a lower-power state to reduce heat dissipation in response to the amount of heat being dissipated exceeding the threshold;
   means for comparing an amount of cooling fluid being provided to cool the computer systems to an excess cooling threshold to determine if excess cooling fluid is available; and
   means for placing one or more electrical components of the computer systems in a higher-power state from a lower-power state if excess cooling fluid is available.

13. The apparatus of claim 12, wherein the means for distributing cooling fluid comprises means for distributing the cooling fluid to the computer systems as a function of the heat dissipated by the computer systems.

14. The apparatus of claim 12, wherein the means for distributing cooling fluid comprises means for distributing the cooling fluid to the computer systems as a function of workload for the computer systems.

* * * * *

UNITED STATES PATENT AND TRADEMARK OFFICE
CERTIFICATE OF CORRECTION

PATENT NO.        : 7,310,737 B2                                            Page 1 of 1
APPLICATION NO.   : 10/608151
DATED             : December 18, 2007
INVENTOR(S)       : Chandrakant D. Patel et al.

It is certified that error appears in the above-identified patent and that said Letters Patent is hereby corrected as shown below:

In column 23, line 4, in Claim 3, delete "System" and insert -- system --, therefor.

Signed and Sealed this

Third Day of June, 2008

JON W. DUDAS
*Director of the United States Patent and Trademark Office*